(12) United States Patent
Lui et al.

(10) Patent No.: US 8,830,680 B2
(45) Date of Patent: Sep. 9, 2014

(54) SYSTEMS AND METHODS FOR HEAT EXTRACTION IN A POWER SUPPLY

(75) Inventors: Albert Lui, San Jose, CA (US); Tom Sidlauskas, Cupertino, CA (US)

(73) Assignee: Public Wireless, Inc., San Jose, CA (US)

( * ) Notice: Subject to any disclaimer, the term of this patent is extended or adjusted under 35 U.S.C. 154(b) by 226 days.

(21) Appl. No.: 13/552,049

(22) Filed: Jul. 18, 2012

(65) Prior Publication Data

US 2013/0021755 A1    Jan. 24, 2013

Related U.S. Application Data

(60) Provisional application No. 61/508,948, filed on Jul. 18, 2011.

(51) Int. Cl.
*H05K 7/20*    (2006.01)
(52) U.S. Cl.
USPC .......... 361/714; 361/702; 361/703; 361/704; 361/715

(58) Field of Classification Search
None
See application file for complete search history.

(56) References Cited

U.S. PATENT DOCUMENTS

| | | | | |
|---|---|---|---|---|
| 5,930,113 | A * | 7/1999 | McCann | 361/704 |
| 6,028,769 | A * | 2/2000 | Zurek | 361/704 |
| 6,573,616 | B2 * | 6/2003 | Yamane | 307/10.1 |
| 6,735,077 | B2 * | 5/2004 | Yamazaki et al. | 361/689 |
| 7,277,286 | B2 * | 10/2007 | Lee | 361/700 |
| 7,460,367 | B2 * | 12/2008 | Tracewell et al. | 361/679.48 |
| 7,633,757 | B2 * | 12/2009 | Gustine et al. | 361/714 |
| 7,911,782 | B2 * | 3/2011 | Attlesey et al. | 361/679.53 |
| 7,911,796 | B2 * | 3/2011 | Vander Ploeg et al. | 361/707 |
| 8,472,184 | B2 * | 6/2013 | Chang | 361/679.52 |
| 2010/0246124 | A1 * | 9/2010 | Strong | 361/695 |

* cited by examiner

*Primary Examiner* — Boris Chervinsky
(74) *Attorney, Agent, or Firm* — Procopio, Cory, Hargreaves & Savitch LLP

(57) ABSTRACT

Power supply and heat sink modules are suitable for use in sealed outdoor enclosures. Circuit elements in the power supply modules are connected to multiple heat sinks. The heat sinks are combined in heat sink modules. The heat sink modules provide high thermal conductivity while avoiding electromagnetic interference.

19 Claims, 3 Drawing Sheets

SYSTEMS AND METHODS FOR HEAT EXTRACTION IN A POWER SUPPLY

CROSS-REFERENCE TO RELATED APPLICATIONS

This application claims the benefit of U.S. provisional application No. 61/508,948, filed Jul. 18, 2011 and titled "Systems and Methods for Heat Extraction in a Power Supply," which is hereby incorporated by reference.

BACKGROUND

Power supplies are a crucial component of most electronic equipment. A power supply commonly converts electricity from a supplied form to a form used by the components of an electronic device. For example, a power supply may convert an AC input to precisely regulated DC voltages. Efficient operation of the power supply is desired to avoid excess energy consumption and because the excess energy is dissipated as heat. Even when a power supply is efficient, it may be a substantial and concentrated source of heat in an electronic device.

A limitation of electronic equipment is inadequate cooling of components of the equipment. Inadequate cooling can impair reliability and impair performance. For example, device reliability may decrease exponentially as the temperature of the device increases. Additionally, a device's performance may degrade as the temperature of the device increases or the performance of the device may need to be lower to avoid excessive temperatures.

Many electronic devices are cooled by air forced over the components by fans. For some electronic devices this is not practical. For example, electronic devices that are to be located outdoors in a harsh environment may be in sealed enclosures so that the components of the devices are protected from the harsh environment. Electronic devices deployed outdoors may be subjected to temperature extremes, for example, −40° C. to 55° C.

Switching power supply techniques are commonly used in many electronic devices. Switching power supplies may be more efficient than power supplies using other techniques. The efficiency may be increased by increasing the switching frequency. However, switching at higher frequencies may cause electromagnetic interference problems when transients associated with the switching couple or radiate from the power supply.

SUMMARY

Systems and methods for heat extraction in a power supply are provided. In one aspect, the invention provides a power supply module suitable for use in outdoor equipment with passive cooling. The power supply module includes: an enclosure including a heat sink module forming a wall of the enclosure, the heat sink module including an outer heat sink, a first inner heat sink, and a thermal interface material disposed between opposing surfaces of the outer heat sink and the first inner heat sink; and a circuit board including a power supply circuit, wherein a first portion of the power supply circuit is thermally coupled to the first inner heat sink.

In another aspect, the invention provides a power supply module suitable for use in outdoor equipment with passive cooling. The power supply module includes: an enclosure including a heat sink forming a wall of the enclosure and a top plate forming another wall of the enclosure; and a circuit board including a power supply circuit, wherein a first portion of the power supply circuit is thermally coupled to the heat sink and a second portion of the power supply circuit is thermally coupled to the top plate.

Other features and advantages of the present invention should be apparent from the following description which illustrates, by way of example, aspects of the invention.

BRIEF DESCRIPTION OF THE DRAWINGS

The details of the present invention, both as to its structure and operation, may be gleaned in part by study of the accompanying drawings, in which like reference numerals refer to like parts, and in which.

DETAILED DESCRIPTION

Figure 1:
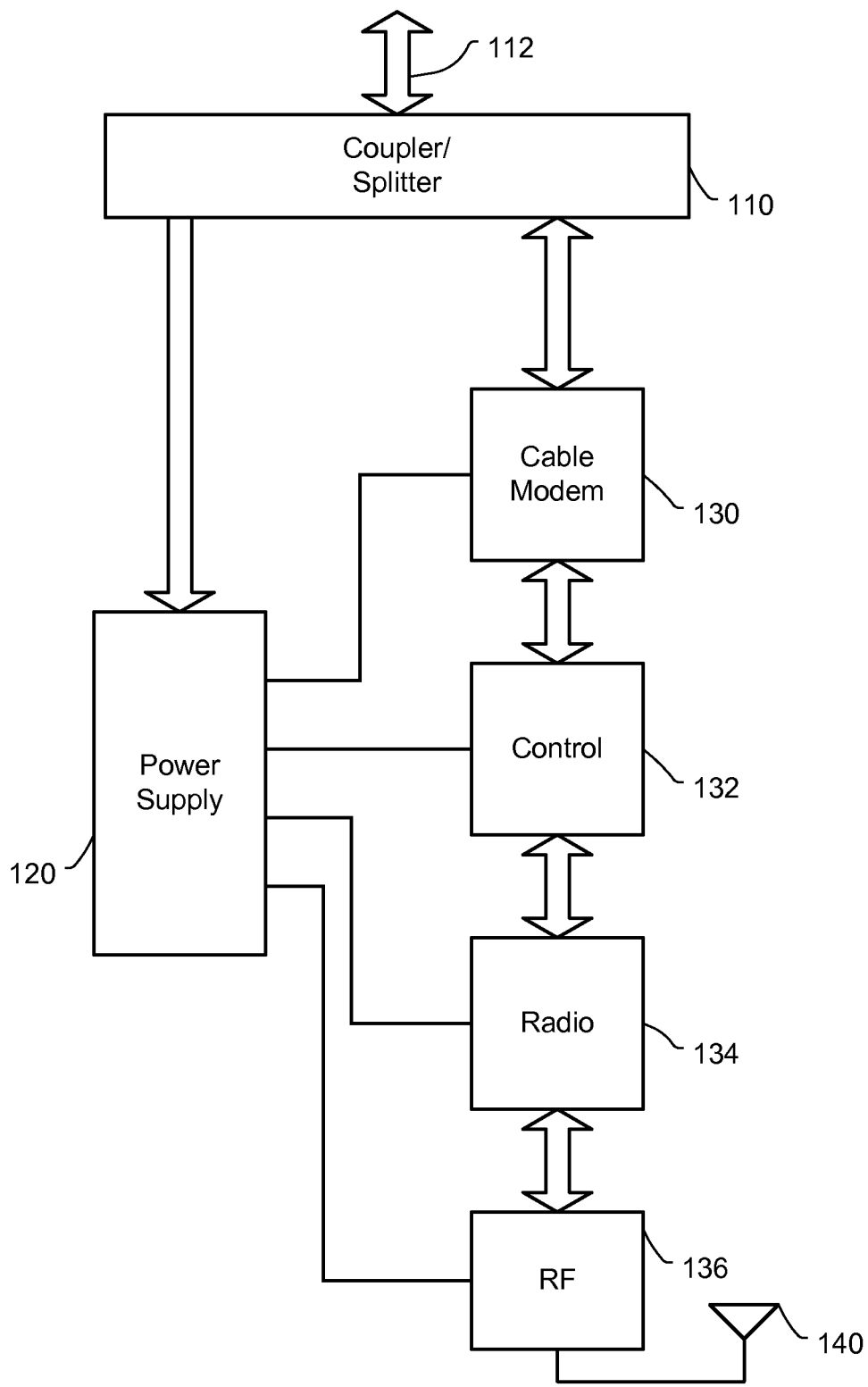
FIG. 1 is a functional block diagram of a wireless picocell in accordance with aspects of the invention.

FIG. 1 is a functional block diagram of a wireless picocell in accordance with aspects of the invention. The wireless picocell is a base station that provides wireless communications to client devices through an antenna 140. The wireless communications are backhauled to system operator facilities through a backhaul connection 112. The wireless picocell may be mounted on a cable strand, for example, an aerial cable of a cable television system.

The wireless picocell includes a radio-frequency circuit module 136 coupled to the antenna 140. The radio-frequency circuit module 136 may tune and amplify wireless signals communicated to and from the wireless picocell. The radio-frequency circuit module 136 is coupled to a radio module 134 that provides signal processing for the wireless communications.

The wireless picocell also includes a cable modem module 130 that provides backhaul communications for the picocell. The cable modem module 130 may operate according to the DOCSIS standard. A control module 132 manages operation of the wireless picocell including communication between the cable modem module 130 and the radio module 134.

A coupler/splitter module 110 couples the cable modem 130 to the backhaul connection 112. The coupling may be via a standard F connector to a coaxial cable. The coupler/splitter module 110 also couples the backhaul connection 112 to a power supply module 120. The power supply module 120 supplies power to the other modules of the wireless picocell from an input power source received from the backhaul connection 112. The input power source may be, for example, a 90 V AC source. The coupler/splitter module 110 separates the input power source from the backhaul communication signals and supplies the input power source to the power supply module 120 and the backhaul communication signals to the cable modem module 130.

The power supply module 120 converts the input power source into the form or forms used by the other modules. For example, the power supply module 120 may convert an unregulated AC input power source into multiple, regulated DC supplies at various voltages.

FIG. 1 illustrates a particular device implementation and many variations are possible. For example, the backhaul connection 112 of the wireless picocell may alternatively be coupled to twisted pairs, fiber optical cables, or wireless links. In another example, the coupler/splitter module 110 may be omitted in an embodiment where power and backhaul communication signals are separately supplied. Additionally, similar devices may be used for Wi-Fi and WiMAX communications. In various embodiments, the wireless picocell may also be termed a microcell or femtocell. Further descriptions of exemplary picocells may be found in U.S. patent application Ser. No. 12/124,470, filed May 21, 2008 and titled "Messenger Strand Mounted Picocell Radio," now U.S. Pat. No. 8,082,007, and U.S. patent application Ser. No. 13/224,054, filed Sep. 1, 2011 and titled "Systems and Methods for Controlling Quality Service at Picocells using Agnostic Platform," which are hereby incorporated by reference.

Figure 2:
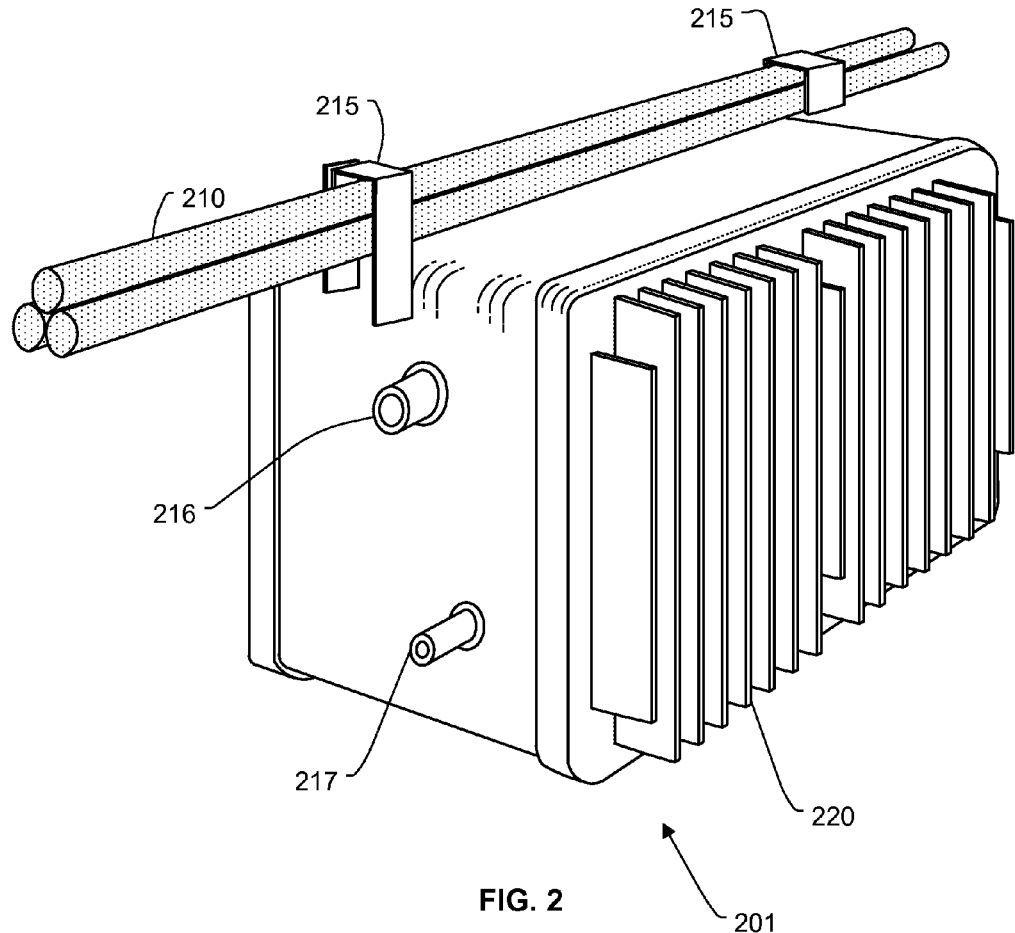
FIG. 2 is a perspective view of a wireless picocell installed on a cable strand in accordance with aspects of the invention.

FIG. 2 is a perspective view of a wireless picocell installed on a cable strand in accordance with aspects of the invention. The wireless picocell, which may be the wireless picocell of FIG. 1, is enclosed in an environmental housing 201. The environmental housing 201 is mounted to a cable strand 210 by brackets 215. The environmental housing 201 has a backhaul connector 201 for connecting the wireless picocell to the cable strand 210. Similarly, the environmental housing 201 has an antenna connection 217 for connecting the wireless picocell to an antenna for wireless communications.

The environmental housing 201 is a sealed enclosure suitable for use in outdoor environments. In the illustrated embodiment, the environmental housing 201 is a generally rectangular box. The environmental housing 201 may be formed, for example, of aluminum. A surface of the environmental housing 201 is substantially covered with fins forming an enclosure heat sink 220. The enclosure heat sink 220 helps dissipate heat produced by the wireless picocell to the environment outside the environmental housing 201.

Figure 3:
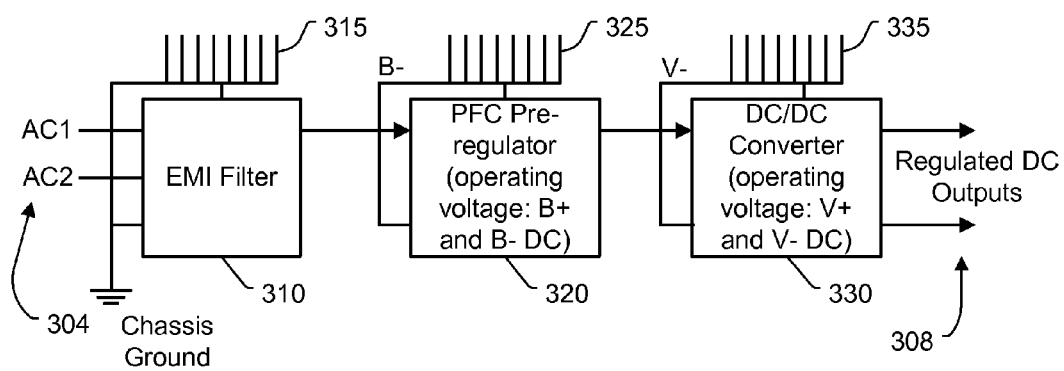
FIG. 3 is a block diagram of a power supply module in accordance with aspects of the invention.

FIG. 3 is a block diagram of a power supply module in accordance with aspects of the invention. The power supply module may be used in the wireless picocells of FIGS. 1 and 2. The power supply module receives an AC source 304 and produce one or more DC outputs 308. The AC source 304 may be unregulated or poorly regulated, for example, having voltages from 35 to 90. The DC outputs 308 are well regulated, for example, having voltage tolerances of 5%.

The power supply module includes multiple stages. In the illustrated embodiment, a first stage 310 includes an electromagnetic-interference filter, for example, using a choke. Various components in the first stage 310 may be coupled to a first heat sink 315. The first heat sink 315 is connected to a chassis ground reference. The first stage 310 couples the AC source 304 to a second stage 320.

The second stage 320 may include functions such as rectifying the AC source 304 and power factor correction. Various components in the second stage 320 are coupled to a second heat sink 325. The second stage 320 supplies positive and negative power rails (B+, B−) to a third stage 330. The second heat sink 325 is connected to the negative power rail of the second stage 330. The negative power rail of the second stage 320 may be the ground reference of the second stage 320.

The third stage 330 may include functions such a switching regulator to convert the rectified AC source to regulated outputs (a DC-to-DC converter). Various components in the third stage 330 are coupled to a third heat sink 335. The third stage 330 operates using positive and negative power rails (V+, V−). The power rails may be output as the DC outputs 308 or used to produce the DC outputs 308. The third heat sink 335 is connected to the negative power rail of the third stage 330.

The negative power rail of the third stage 330 may be the ground reference of the third stage 330.

The heat sinks of the power supply module may be capacitively coupled. For example, the second heat sink 325 and the third heat sink 335 may be capacitively coupled to the first heat sink 315. The capacitive coupling may be through a thermal interface medium that also thermally couples the heat sinks. The coupling of the heat sinks to their respective ground signals or reference rails may be a direct ohmic contact. Alternatively, the coupling of the heat sinks to their respective ground signals or reference rails may be indirect, for example, via capacitors.

FIG. 3 illustrates a particular power supply module implementation and many variations are possible. For example, other power supply module may have a different number of stages. The distribution of functions between the stages may also vary.

Figure 4:
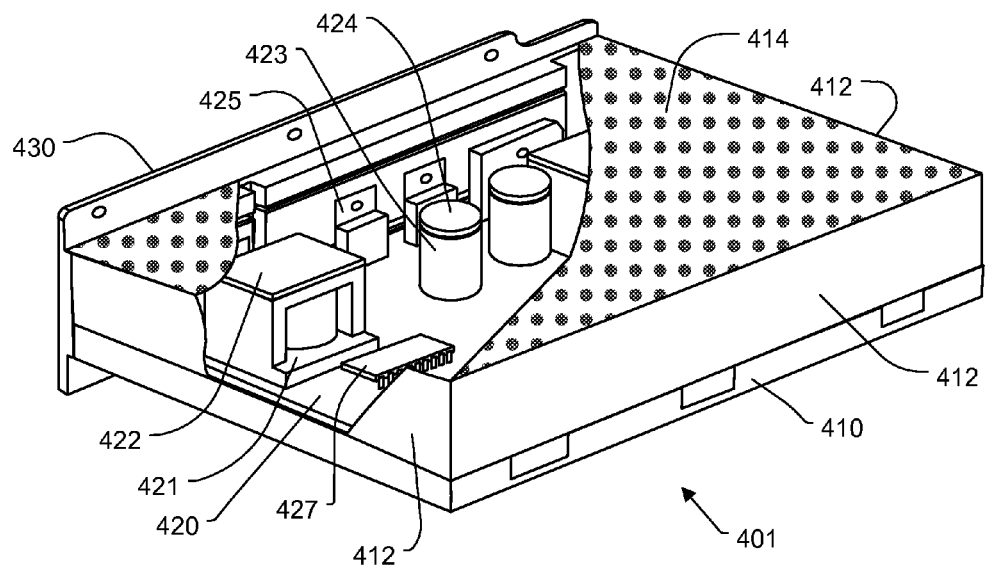
FIG. 4 is a partial cutaway view of a power supply module in accordance with aspects of the invention.

FIG. 4 is a partial cutaway view of a power supply module in accordance with aspects of the invention. The power supply module is housed in enclosure 401 that has a generally rectangular box shape. The enclosure 401 includes a base 410. Three side walls 412 extend from edges of the base 410. A heat sink module 430 forms a fourth wall of the enclosure 401. The outer surface of the heat sink module 430 is generally planar. A top plate 414 that is generally parallel to the base 410 adjoins the walls to complete the enclosure 401. The term top is used for convenient description with reference to the figures, but no particular spatial orientation should be inferred. Parts of the enclosure 401 may be formed of sheet metal.

In the illustrated embodiment, the top plate 414 is perforated. The perforations allow air flow into and out of the power supply module. Although the perforations in the top plate 414 are an array of round openings in the embodiment of FIG. 4, other shapes and arrangements may also be used. Perforations may also be included in the base 410 and the side walls 412.

The power supply module includes a circuit board 420. Circuit elements of the power supply are mounted on the circuit board 420. In one embodiment, an LLC resonant AC-to-DC converter circuit is used. This type of circuit achieves AC-to-DC conversion with a small number of heat generating components. An LLC converter can provide higher overall efficiency, which translates to lower losses and less heat generated. Also, with an LLC converter, providing cooling can be less costly with a small number of components to cool.

The circuit elements may include a bridge rectifier and diodes. The bridge rectifier and diodes may be selected to have low forward diode voltages. The circuit elements may also include charging capacitors for the rectifier and output capacitors for the outputs of the switching regulator. The capacitors may be selected to have low equivalent series resistances to achieve low ripple currents. The circuit elements may also include switching MOSFETs. The switching MOSFETs may be selected to have fast switching and low on resistances. The circuit elements may also include inductors and transformers. The inductors and transformers may be selected to have low core losses and leakage inductances and may be constructed with Litz wire for low DC and AC resistances.

Some of the circuit elements are also connected to the heat sink module 430. In the power supply module of FIG. 4, the illustrated circuit elements connected to the heat sink module 430 include a power transistor 425. Generally, the circuit elements that have relatively high power dissipations may be connected to the heat sink module 430. For example, switching MOSFETs of a regulator circuit and diodes of a rectifier circuit may be connected to the heat sink module 430. The circuit elements connected to the heat sink module 430 may be thermally connected but electrically isolated with appropriate mounting hardware. Connecting high-power circuit elements to the heat sink module 430 provides effective cooling for those circuit elements.

Some of the circuit elements are thermally connected to the top plate 414. In the power supply module of FIG. 4, the illustrated circuit elements connected to the heat sink module 430 include a transformer 421 and a capacitor 423. The transformer 421 is coupled to the top plate 414 via a first thermal pad 422. The capacitor 423 is coupled to the top plate 414 via a second thermal pad 424. Coupling circuit elements to the top plate 414 may improve cooling by lowing thermal resistance in cooling paths to the circuit elements. Generally, the circuit elements that have modest power dissipations may be connected to the top plate 414. For example, transformers used in the switching regulator and capacitors used for rectifying and output filtering may be connected to the top plate 414. The top plate 414 may be considered a secondary heat sink and the heat sink module 430 may be considered a primary heat sink. In an embodiment, the primary heat sink may be used for cooling active components and the secondary heat sink may be used for passive components.

Other circuit elements, for example, a switching controller 427 are not specifically connected to the heat sink module 430 or the top plate 414. Generally, the circuit elements that have relatively low power dissipations are not specifically connected to the heat sink module 430 or the top plate 414.

The power supply module of FIG. 4 may be installed in the environmental housing 201 of FIG. 2 so that the outer surface of the heat sink module 430 is efficiently thermally coupled to the enclosure heat sink 220 of the environmental housing 201. For example, the heat sink module 430 may be mated to an inner surface of the enclosure heat sink 220 via a thermal interface material such as a thermal paste, thermal pad, or thermal tape. This provides a low resistance thermal path from the circuit elements connected to the heat sink module 430 to the environment outside the environmental housing 201 via the enclosure heat sink 220.

FIG. 4 illustrates a particular power supply module implementation and many variations are possible. For example, some circuit elements may be coupled to the side walls of the enclosure. Also, the shape of the enclosure may be varied.

Figure 5:
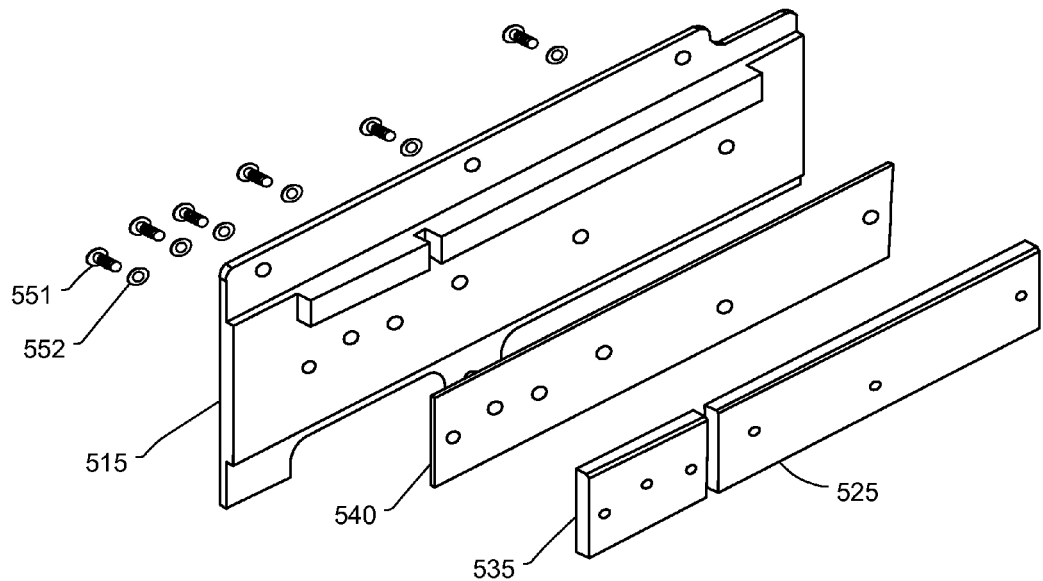
FIG. 5 is an exploded view of a heat sink module in accordance with aspects of the invention.

FIG. 5 is an exploded view of a heat sink module in accordance with aspects of the invention. The heat sink module may be used in the power supply modules of FIGS. 3 and 4. The heat sink module of FIG. 5 includes an outer heat sink 515, a first inner heat sink 525, and a second inner heat sink 535. The heat sinks may be made of suitable materials that provide low thermal resistances, for example, copper and aluminum. Each of the heat sinks has a thin rectangular section.

A thermal interface material 540 is located between the outer heat sink 515 and the first inner heat sink 525 and between the outer heat sink 515 and the second inner heat sink 535. The thermal interface material 540 is formed of a material that provides high electrical insulation and high thermal conductivity, for example, a thermal pad or thermal tape.

When used in the power supply module of FIG. 4, the outer heat sink 515 also serves as a wall of the enclosure 401. Circuit devices to be cooled may be mounted to the first inner heat sink 525 and the second inner heat sink 535. The heat sinks and the devices mounted to them may be secured together by screws 551 extending through the components. Shoulder washers 552 may be used to electrically insulate the screws 551. Other suitable fasteners may also be used.

When the heat sink module of FIG. 5 is used in the power supply module of FIG. 3, the outer heat sink 515 may be connected to the chassis ground; the first inner heat sink 525 may be connected to the negative power rail of the second stage 320; the second inner heat sink 535 may be connected to the negative power rail of the third stage 330. Devices connected to the heat sink module may be sources of electromagnetic interference. For example, a switching MOSFET may produce large electrical transients that could be radiated by the heat sink. When the MOSFET is packaged in a TO-220 package, for example, the tab of the package is commonly connected to the drain terminal of the MOSFET. Even when the tab of the package is electrically isolated from the heat sink, there can be a large capacitance between the tab and the heat sink that couples transients from the drain terminal to the heat sink.

The heat sink module of FIG. 5 reduces electromagnetic interference while still providing excellent heat transfer characteristics. By having separate heat sinks, coupling between components of a power supply module can be reduced. The outer heat sink 515 can serve to block or absorb electromagnetic interference that may be associated with the first inner heat sink 525 and the second inner heat sink 535.

FIG. 5 illustrates a particular embodiment of a heat sink module. Many variations are possible. For example, the number of inner heat sinks may vary. Additionally, the relative sizes and locations of the components may vary.

The power supply and heat sink modules described herein have multiple advantages over other power supply and heat sink modules. The power supply modules are highly efficient so that power losses are low. The modules can be operated with passive cooling avoiding the use of fans. The mechanical packaging used can be easily and reliably installed in enclosures. For example, installation may be simplified when only one surface of a power supply module is mounted to an enclosure heat sink. The compact heat sink arrangements avoid high stray resistances, inductances, and capacitances associated with large spatial separations. Testing of devices constructed according to the various disclosed embodiments shows that very moderate temperature rises are recorded for both active and passive heat generating components in sealed outdoor enclosures allowing the devices to operate without thermal de-rating at temperatures up to 85° C.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the invention. In addition, the grouping of functions within a module, block, or step is for ease of description. Specific functions or steps can be moved from one module or block without departing from the invention.

The various illustrative blocks and modules described in connection with the embodiments disclosed herein can be implemented in or with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A power supply module suitable for use in outdoor equipment with passive cooling, the power supply module comprising:
    an enclosure including a heat sink module forming a wall of the enclosure, the heat sink module including an outer heat sink, a first inner heat sink, and a thermal interface material disposed between opposing surfaces of the outer heat sink and the first inner heat sink; and
    a circuit board including a power supply circuit, wherein a first portion of the power supply circuit is thermally coupled to the first inner heat sink.

2. The power supply module of claim 1, wherein the outer heat sink is coupled to a chassis ground reference.

3. The power supply module of claim 2, wherein the first inner heat sink is coupled to a power rail associated with components in the first portion of the power supply circuit.

4. The power supply module of claim 1, wherein the heat sink module further includes a second inner heat sink separated from the outer heat sink by the thermal interface material, and wherein a second portion of the power supply circuit is thermally coupled to the second inner heat sink.

5. The power supply module of claim 4, wherein the power supply circuit includes a rectifying and power factor correction stage and a DC-to-DC converter stage, wherein components in the first portion of the power supply circuit are associated with the rectifying and power factor correction stage, and wherein components in the second portion of the power supply circuit are associated with the DC-to-DC converter stage.

6. The power supply module of claim 5, wherein the first inner heat sink is coupled to a power rail associated with the rectifying and power factor correction stage, and wherein the second inner heat sink is coupled to a power rail associated with the DC-to-DC converter stage.

7. The power supply module of claim 6, wherein the outer heat sink is coupled to a chassis ground reference.

8. The power supply module of claim 5, wherein the enclosure further includes a top plate forming another wall of the enclosure, and wherein a third portion of the power supply circuit is thermally coupled to the top plate.

9. The power supply module of claim 8, wherein the third portion of the power supply circuit includes components associated with the rectifying and power factor correction stage and components associated the DC-to-DC converter stage.

10. The power supply module of claim 1, wherein the enclosure further includes a top plate forming another wall of the enclosure, and wherein a third portion of the power supply circuit is thermally coupled to the top plate.

11. The power supply module of claim 1, wherein the heat sink module is arranged for mounting the power supply module in an environmental housing with a surface of the outer heat sink connected to an enclosure heat sink of the environmental housing.

12. A power supply module suitable for use in outdoor equipment with passive cooling, the power supply module comprising:
    an enclosure including a heat sink forming a wall of the enclosure and a top plate forming another wall of the enclosure; and
    a circuit board including a power supply circuit, wherein a first portion of the power supply circuit is thermally coupled to the heat sink and a second portion of the power supply circuit is thermally coupled to the top plate.

13. The power supply module of claim 12, wherein the first portion of the power supply circuit consists of one or more active components.

14. The power supply module of claim 13, wherein the active components in the first portion of the power supply circuit include a bridge rectifier.

15. The power supply module of claim 13, wherein the active components in the first portion of the power supply circuit include a power MOSFET.

16. The power supply module of claim 13, wherein the second portion of the power supply circuit consists of one or more passive components.

17. The power supply module of claim 16, wherein the passive components in the second portion of the power supply circuit include a transformer.

18. The power supply module of claim 16, wherein the passive components in the second portion of the power supply circuit include a filter capacitor.

19. The power supply module of claim 12, wherein the heat sink is arranged for mounting the power supply module in an environmental housing with a surface of the heat sink connected to an enclosure heat sink of the environmental housing.

* * * * *